(12) United States Patent
Nagashima et al.

(10) Patent No.: US 7,368,797 B2
(45) Date of Patent: May 6, 2008

(54) PHOTOELECTRIC CONVERSION ELEMENT AND METHOD OF MANUFACTURING THE SAME

(75) Inventors: Tomonori Nagashima, Susono (JP); Kenichi Okumura, Susono (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 179 days.

(21) Appl. No.: 11/135,329

(22) Filed: May 24, 2005

(65) Prior Publication Data
US 2005/0205960 A1    Sep. 22, 2005

Related U.S. Application Data

(62) Division of application No. 10/291,638, filed on Nov. 12, 2002, now Pat. No. 6,927,417.

(30) Foreign Application Priority Data
Nov. 13, 2001 (JP) .................. P. 2001-347808

(51) Int. Cl.
*H01L 31/06* (2006.01)
(52) U.S. Cl. ............ 257/461; 257/431; 257/433; 257/436; 257/437; 257/439; 257/E27.123
(58) Field of Classification Search ......... 257/431, 257/433, 436, 437, 439
See application file for complete search history.

(56) References Cited

U.S. PATENT DOCUMENTS 5,103,851 A    4/1992 Nishida et al.

(Continued)

FOREIGN PATENT DOCUMENTS

JP    54041091 A    3/1979

(Continued)

OTHER PUBLICATIONS

A. Aberle et al, "Progress in low-temperature surface passivation of silicon solar cells using remote-plasma silicon nitride," *Progress in Photovoltaics: Research and Applications*, vol. 5, pp. 29-50 (1997).

(Continued)

*Primary Examiner*—Wai-Sing Louie
(74) *Attorney, Agent, or Firm*—Finnegan, Henderson, Farabow, Garrett & Dunner, L.L.P.

(57) ABSTRACT

In a back-surface electrode type photoelectric conversion element having electrodes and semiconductor layers for collecting carriers disposed only on a back surface side of a semiconductor substrate, a semiconductor thin film that is larger in band gap than the semiconductor substrate and that contains an element causing a conductivity identical to or different from a conductivity of the semiconductor substrate is provided on a light-receiving surface side of the semiconductor substrate, and a diffusion layer is formed on a surface of the semiconductor substrate. Alternatively, 95% or more of light beams having a wavelength of anywhere from 800 nm to 2000 nm are caused to penetrate the light-receiving surface side of the semiconductor substrate, and an insulative thin film containing an element causing a conductivity identical to or different from the conductivity of the semiconductor substrate is provided so as to form a diffusion layer on the surface of the semiconductor substrate through diffusion of the element.

4 Claims, 10 Drawing Sheets

U.S. PATENT DOCUMENTS

| | | | |
|---|---|---|---|
| 5,437,734 | A | 8/1995 | Matsushita |
| 5,738,732 | A | 4/1998 | Nakamura et al. |
| 6,071,753 | A | 6/2000 | Arimoto |
| 6,130,380 | A | 10/2000 | Nakamura |
| 6,166,320 | A | 12/2000 | Nagashima et al. |
| 6,548,751 | B2 | 4/2003 | Sverdrup et al. |
| 6,927,417 | B2 * | 8/2005 | Nagashima et al. .......... 257/55 |
| 2002/0011590 | A1 | 1/2002 | Nagashima |

FOREIGN PATENT DOCUMENTS

| | | |
|---|---|---|
| JP | 55154781 A | 12/1980 |
| JP | 60-76176 | 4/1985 |
| JP | 63316486 A | 12/1988 |
| JP | 4-27169 | 1/1992 |
| JP | 4-192371 | 7/1992 |
| JP | 05082812 A | 4/1993 |
| JP | 09055521 A | 2/1997 |
| JP | 11274532 A | 10/1999 |
| JP | 11317533 A | 11/1999 |
| JP | 200196114 A | 7/2000 |
| JP | 2001-189474 | 7/2001 |
| WO | WO99/48157 | 9/1999 |

OTHER PUBLICATIONS

A. Aberle et al., "High-efficiency silicon solar cells: Si/SiO$_2$ interface parameters and their impact on device performance," *Progress in Photovoltaics: Research and Applications*, vol. 2, pp. 265,276 (1994).

T. Nagashima et al., "Three-terminal tandem solar cells with a back-contact type bottom cell," Toyota Motor Corporation, *IEEE*, pp. 1193-1196 (2000).

Hansson et al., "Growth of high quality c-SiGe p-n double layers for high-efficiency solar cells," *First WCPEC, IEEE*, pp. 1254-1257, Dec. 5-9, 1994; Hawaii.

R. A. Sinton et al., "An optimization study of Si point-contact concentrator solar cells," *IEEE Photovoltaic Specialists Conference*, pp. 1201-1208 (1987).

P. J. Verlinden et al., "High efficiency silicon point-contact solar cells for concentrator and high value one-sun application," *13$^{th}$European Photovoltaic Solar Energy Conference*, pp. 1477-1480 (Apr. 1994).

W. Warta et al., "The effect of surface charges on the recombination at Si-SiO$_2$ interfaces," *Fundamentals, Novel Devices and New Materials*, pp. 100-103 (Jul. 1988).

J. Dicker et al., "Characterization of high-efficiency silicon solar cells with rear side contacts," *Fundamentals, Novel Devices and New Materials*, pp. 95-99 (Jul. 1998).

M. Kerr et al., "Comparison of the open circuit voltage of simplified PERC cells passivated with PECVD silicon nitride and thermal silicon oxide," *Progress in Photovoltaics: Research and Applications*, vol. 8, pp. 529-536 (May 2000).

Japanese Official Action dated Oct. 16, 2007.

\* cited by examiner

PHOTOELECTRIC CONVERSION ELEMENT AND METHOD OF MANUFACTURING THE SAME

INCORPORATION BY REFERENCE

This is a division of application Ser. No. 10/291,638, filed Nov. 12, 2002 now U.S. Pat. No. 6,927,417 which is incorporated herein by reference.

The disclosure of Japanese Patent Application No. 2001-347808 filed on Nov. 13, 2001, including the specification, drawings, and abstract is incorporated herein by reference in its entirety.

BACKGROUND OF THE INVENTION

1. Field of the Invention

The invention relates to a photoelectric conversion element suited for a thermophotovoltaic power generation device that converts radiant light emitted from a light-emitting body heated by a heat source into electric power by means of a photoelectric conversion element.

2. Description of the Related Art

As an art for directly obtaining electric energy from fossil fuel or combustible gas, power generation based on thermophotovoltaic energy conversion, namely, thermophotovoltaic power generation (TPV power generation) has been drawing attention. According to the mechanism of TPV power generation, radiant light is generated from a light-emitting body (radiant body or emitter) by applying combustion heat output from a heat source to the light-emitting body, and a photoelectric conversion element (solar cell) is irradiated with the radiant light so as to obtain electric energy. A TPV power generation device has no movable portions and thus can be realized as a noise-free and oscillation-free system. TPV power generation is advantageous in terms of cleanness, tranquility, and the like as a source of energy in the forthcoming generation.

For instance, Japanese Patent Laid-Open Application No. 63-316486 discloses a thermophotovoltaic power generation device composed of a light-emitting body made of a porous solid, light-emitting body heating means designed for the passage of exhaust gas through the light-emitting body, and a photoelectric conversion element for converting radiant energy radiated from the light-emitting body into electric energy.

In TPV power generation, infrared light obtained from a light-emitting body at a temperature of 1000 to 1700° C. is used. To convert light beams radiated from the light-emitting body and having a wavelength of 1.4 to 1.7 µm into electricity, it is necessary to use a photoelectric conversion element fabricated from a material having a small band gap (Eg). Because Si (silicon) as a generally employed material can convert only light beams having a wavelength equal to or smaller than 1.1 µm into electricity, it is not quite suited for a photoelectric conversion element.

A material having a band gap (Eg) of 0.5 to 0.7 ev is suited for a photoelectric conversion element designed for a TPV power generation device. Representative materials suited for a photoelectric conversion element include GaSb (gallium antimony, Eg=0.72 eV), InGaAs (indium gallium arsenic, Eg=0.60 eV), Ge (germanium, Eg=0.66 eV), and the like.

As a method of enhancing the energy efficiency of TPV power generation, reducing an amount of use of an expensive photoelectric conversion element, and thus reducing cost, the intensity of light beams generated by a light-emitting body is increased. If the intensity of light beams is multiplied by 100, the amount of use of the photoelectric conversion element is reduced to 1/100 thereof. As a result, the cost can be substantially reduced, and the energy conversion efficiency can be improved as well.

In this case, the amount of generation of electric current increases. Hence, the photoelectric conversion element in accordance with the related art is required to have a substantially increased area of a front surface side electrode so as to reduce a resistance loss. However, if the area of the front surface side electrode increases, the amount of light impinging on the photoelectric conversion element decreases, whereby a drawback, that is, unavailingness of an increased light intensity is caused.

On the other hand, there is a back-surface electrode type structure with no electrode on the front surface side. This structure is adopted in a beam-condensing power generation system. However, this back-surface electrode type is realized by using only an indirect transition type material having an increased carrier diffusion length. In fact, the back-surface electrode type is realized by using only Si. One of those indirect transition type materials having a small band gap is Ge (germanium). At the moment, none of photoelectric conversion elements made of Ge and adopting a back-surface electrode type as an electrode structure have been put into practical use.

Thus, in the specification and drawings attached to the application form of Japanese Patent Application No. 2000-105408, the applicant of this invention proposed a photoelectric conversion element whose element structure capable of substantially reducing a carrier recombination loss on a surface makes it possible to adopt Ge as a material suited for TPV power generation and to adopt a back surface electrode type as an electrode structure.

In the photoelectric conversion element proposed by the applicant, a diffusion layer for controlling movement of electrodes is provided as a means for reducing a carrier recombination loss on a light-receiving surface side. However, if a thermal diffusion method or an ion implantation method applied to a Si material is used as a method of forming the diffusion layer, the following problems are caused.

That is, according to the ion implantation method, ions at high energy levels are implanted in the surface of a substrate. Thus, the number of crystal defects on the surface increases, and the recombination loss increases. Hence, if the ion implantation method is applied to the light-receiving surface side where a large number of carriers are generated, there arises an obstacle to the enhancement of the photoelectric conversion efficiency.

Further, according to the thermal diffusion method, the diffusion layer is formed in an oxidative atmosphere. Thus, the Ge surface is inhomogeneously oxidized and becomes rough, whereby the number of crystal defects is increased. Accordingly, in this case as well, there arises an obstacle to the enhancement of the photoelectric conversion efficiency.

SUMMARY OF THE INVENTION

The invention has been made in consideration of the aforementioned problems. It is an object of the invention to provide, with a view to solving the problems caused by the ion implantation method, the thermal diffusion method, and the like in accordance with the related art, a photoelectric conversion element having an element structure allowing a light-receiving surface side semiconductor layer (diffusion layer) for controlling movement of electrodes and reducing a recombination loss to be formed in a reducing atmosphere or an inactive gas atmosphere, and a method of manufacturing the photoelectric conversion element. It is thus an object of the invention to reduce a carrier recombination loss on a light-receiving surface of a photoelectric conversion element made of Ge as a material suited for TPV power generation and adopting a back-surface electrode type as an electrode structure, and to thereby enhance the conversion efficiency of the photoelectric conversion element and increase the power generation amount of a TPV system.

In order to achieve the aforementioned objects, a photoelectric conversion element in accordance with one aspect of the invention has electrodes and semiconductor layers for collecting carriers disposed only on a back surface of a semiconductor substrate, and comprises either a semiconductor thin film or an insulative film and one of two types of diffusion layers. The semiconductor thin film is constructed of a semiconductor that is larger in band gap than the semiconductor substrate, contains an element causing a conductivity identical to or different from a conductivity of the semiconductor substrate, and is disposed on the light-receiving surface side of the semiconductor substrate. The insulative thin film allows penetration of 95% or more of light beams having a wavelength of anywhere from 800 nm to 2000 nm, contains an element causing a conductivity identical to or different from a conductivity of the semiconductor substrate, and is disposed on the light-receiving surface side of the semiconductor substrate. One of the diffusion layers is formed on a surface of the semiconductor substrate through diffusion of the element contained in the semiconductor thin film and contains an element causing a conductivity at a higher concentration than the element causing the conductivity in the semiconductor substrate. The other diffusion layer is formed on the surface of the semiconductor substrate through diffusion of the element contained in the semiconductor thin film and forms a pn junction together with the semiconductor substrate.

In the photoelectric conversion element constructed as described above, the carrier recombination loss on the light-receiving surface side is reduced and the conversion efficiency of the photoelectric conversion element is increased.

A method of manufacturing the photoelectric conversion element having the aforementioned construction wherein the semiconductor thin film is mainly composed of a crystalline, polycrystalline, or amorphous substance which is SiGe, Si, SiC, or C or wherein the insulative thin film is mainly composed of SiNx, SiOx, TaOx, or TiOx comprises a step of forming the semiconductor thin film or the insulative thin film by depositing the element constituting the semiconductor thin film or the insulative thin film on the semiconductor substrate by means of a plasma CVD method.

According to this method of manufacturing the photoelectric conversion element, the desired thin film can be formed with high precision by setting various conditions.

Furthermore, the method of manufacturing the photoelectric conversion element having the aforementioned construction and comprising the semiconductor thin film as a semiconductor of a III-V-class compound comprises a step of forming the semiconductor thin film by depositing the element constituting the semiconductor thin film or the insulative thin film on the semiconductor substrate by means of an MOCVD method.

According to this method of manufacturing the photoelectric conversion element, an increase in the number of defects on the surface of the substrate is prevented through a thermal treatment in a reducing atmosphere or an inactive atmosphere.

DETAILED DESCRIPTION OF PREFERRED EMBODIMENTS

Embodiments of the invention will be described hereinafter with reference to the accompanying drawings.

First Embodiment

Figure 1:
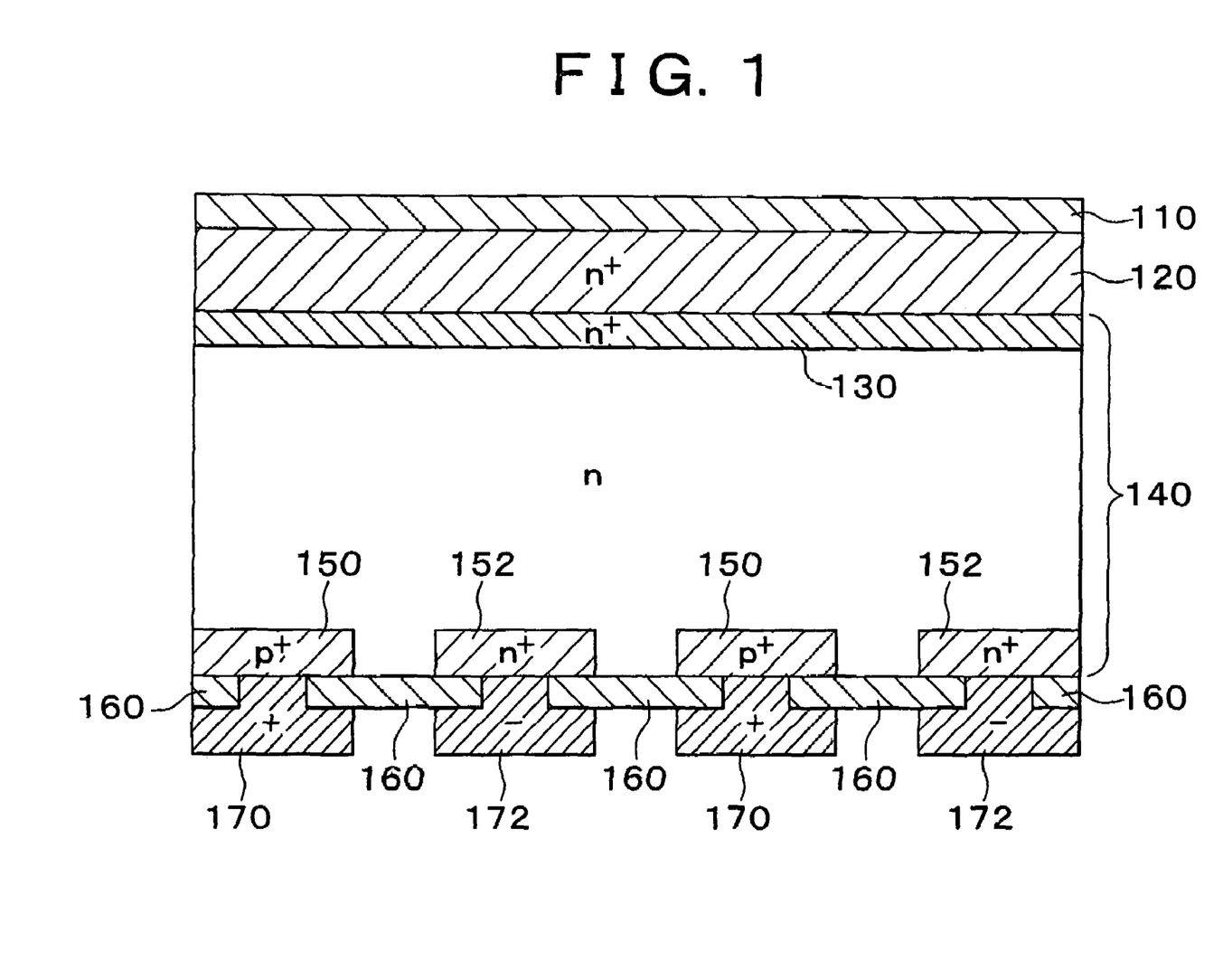
FIG. 1 is a cross-sectional view of a photoelectric conversion element in accordance with a first embodiment of the invention.

FIG. 1 is a cross-sectional view of a photoelectric conversion element in accordance with a first embodiment of the invention. First of all, a light-receiving surface side of the basic construction of the photoelectric conversion element shown in FIG. 1 will be described. A reflection-preventing film 110 is a multi-layer optical thin film provided to reduce a light reflection loss. The reflection-preventing film 110 functions as a protective film for protecting a surface of a wide-gap semiconductor thin film 120, which will be described later. The reflection-preventing film 110 reduces the number of defects on an interface between the reflection-preventing film 110 and the semiconductor thin film 120.

The wide-gap semiconductor thin film 120 is constructed of a semiconductor that is larger in band gap than a semiconductor substrate 140. The wide-gap semiconductor thin film 120 has an element causing a conductivity identical to a conductivity of the semiconductor substrate 140, and the concentration of the element contained in the wide-gap semiconductor thin film 120 is higher than the concentration of the element contained in the semiconductor substrate 140.

In FIG. 1, an upper $n^+$ layer (hereinafter referred to as "a light-receiving surface side $n^+$ layer") 130 as a diffusion layer controls a moving direction of carriers and reduces a recombination loss on an interface that has a large number of defects. The light-receiving surface side $n^+$ layer 130 forms a hetero junction together with the wide-gap semiconductor thin film 120 that is located on the upper side. The light-receiving surface side $n^+$ layer 130 further enhances the effect of controlling the moving direction of the carriers by means of an energy band of the hetero junction and has the effect of further reducing a recombination loss on the interface.

The semiconductor substrate 140 is mainly composed of a IV-class element (Si, Ge), which is an n-type IV-class element with a long life time. Back surface side p+ layers 150 and back surface side n+ layers 152, which are on the back surface side (in the lower part in FIG. 1) of the photoelectric conversion element, are semiconductor layers for separating electrons and positive holes generated in the semiconductor substrate 140 and collecting them in later-described electrodes. Back surface side insulator films 160 protect the semiconductor layers, and insulate and separate "+" electrodes 170 and "−" electrodes 172 from each other. Each of the "+" electrodes 170 and each of the "−" electrodes 172 are connected to a corresponding one of the back surface side p+ layers 150 and a corresponding one of the back surface side n+ layers 152 respectively. The "+" electrodes 170 and the "−" electrodes 172 take out carriers produced in the semiconductor layers as electric current.

Although the construction of the photoelectric conversion element employing the n-type substrate is shown in the first embodiment, a substantially identical construction can be fabricated by replacing p- and n-layers with each other in the case where a p-type substrate is employed.

Next, the operation of the photoelectric conversion element shown in FIG. 1 will be described.

First of all, the wide-gap semiconductor thin film 120 having the element causing conductivity is formed on the light-receiving surface side of the semiconductor substrate 140, whereby the light-receiving surface side n+ layer 130 of the semiconductor substrate 140 is formed at the time of manufacture without being exposed to oxidative atmosphere.

Secondly, the light-receiving surface side n+ layer 130 designed as a diffusion layer whose concentration of the element causing conductivity in the light-receiving surface side of the semiconductor substrate 140 (i.e., carrier concentration) is higher than the concentration of the element contained in the semiconductor substrate 140 is provided, whereby carriers produced by light are prevented from moving toward the interface having a large number of defects.

Thirdly, the hetero junction formed by the wide-gap semiconductor thin film 120 and the light-receiving surface side n+ layer 130 as the diffusion layer of the semiconductor substrate 140 enhances the effect of preventing carriers produced by light from moving toward the interface having a large number of defects.

Thus, the carrier recombination loss on the light-receiving surface side is reduced. As an effect of this reduction, the conversion efficiency of the photoelectric conversion element is increased. As a result, in the case where the photoelectric conversion element is employed in a TPV system, the power generation amount of the TPV system is increased.

The concrete structure (design values) of the photoelectric conversion element shown in FIG. 1 will now be described. The reflection-preventing film 110 is a multi-layer film composed of $MgF_2$ and ZnS. The reflection-preventing film 110 allows penetration of those light beams which are emitted from a light-emitting body (emitter) of the TPV and which are in such a wavelength range that conversion into electric current by means of the photoelectric conversion element is possible, and causes the semiconductor layers to absorb them. The reflection-preventing film 110 reflects unnecessary light beams and thus prevents a rise in the temperature of the photoelectric conversion element.

The wide-gap semiconductor thin film 120 is a poly-crystal Si film, which is a thin film obtained by crystallizing an amorphous Si film through thermal treatment. The amorphous Si film contains hydrogen and phosphorus (P) as an element for causing conductivity. The wide-gap semiconductor thin film 120 has a thickness of 300 nm, a phosphorus (P) element concentration of 0.1 to 5% (atomic %), and a hydrogen concentration of 0.01 to 10% (atomic %).

The semiconductor substrate 140 will now be described. The semiconductor substrate 140 has a substrate made of crystalline Ge. The light-receiving surface side n+ layer 130 as an n+ layer has a surface carrier concentration of $1 \times 10^{18}$ $cm^{-3}$ and a diffusion depth of 0.5 μm. The semiconductor substrate 140 has a thickness of 150 μm and is designed as an n-type substrate with a carrier concentration of $1 \times 10^{15}$ $cm^{-3}$. The back surface side p+ layers 150 have a surface carrier concentration of $1 \times 10^{19}$ $cm^{-3}$ and a diffusion depth of 1.5 μm. The back surface side n+ layers 152 have a surface carrier concentration $1 \times 10^{19}$ $cm^{-3}$ and a diffusion depth of 1.5 μm. It is to be noted herein that the light-receiving surface side n+ layer 130 is formed by the diffusion of phosphorus (P) contained in the amorphous Si thin film during thermal treatment.

The back surface side-insulator films 160 are SiNx films.

The combination of the p- and n-layers in the concrete example is not limited to the aforementioned one. As another construction, it is also possible to adopt a reversed combination. Although phosphorus (P) is used as an element for causing conductivity in the first embodiment, boron (B), aluminum (Al), gallium (Ga), indium (In), or the like may be used as an element for forming the p-layer. Further, nitrogen (N), arsenic (As), antimony (Sb), or the like may be used as an element for forming the n-layer.

According to the aforementioned concrete structure, Ge, which has a band gap suited for the light-emitting body (emitter) of the TPV system, constitutes the back surface electrode as a main material. Hence, in addition to the operation and effect obtained from the aforementioned basic construction, the effect of making it possible to increase the power generation amount of the TPV system is achieved.

Second Embodiment

Figure 2:
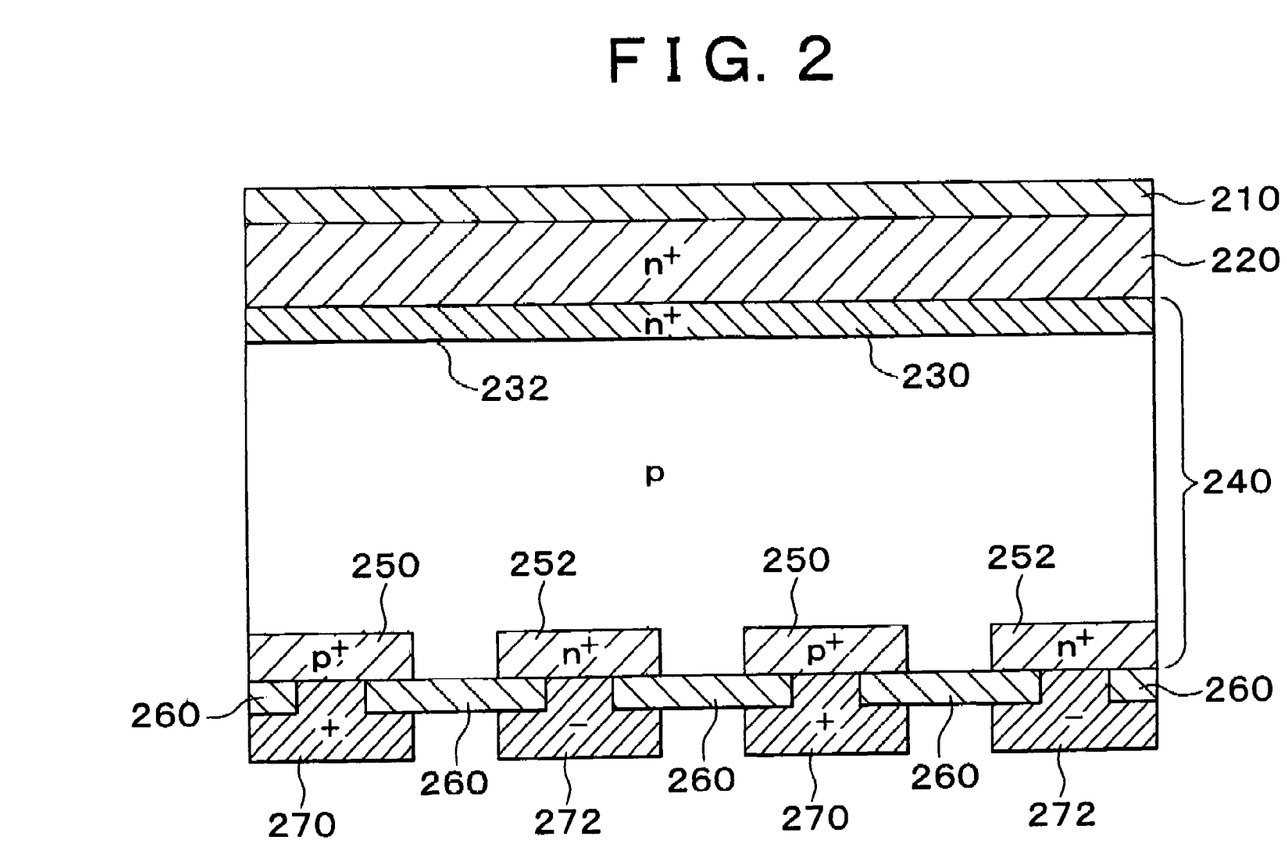
FIG. 2 is a cross-sectional view of a photoelectric conversion element in accordance with a second embodiment of the invention.

FIG. 2 is a cross-sectional view of the photoelectric conversion element in accordance with a second embodiment of the invention. First of all, a light-receiving surface side of the basic construction of the photoelectric conversion element shown in FIG. 2 will be described. A reflection-preventing film 210 is substantially the same as the reflection-preventing film 110 of the photoelectric conversion element shown in FIG. 1.

A wide-gap semiconductor thin film 220 is constructed of a semiconductor that is larger in band gap than a semiconductor substrate 240, and contains an element causing a conductivity that is different from a conductivity of the semiconductor substrate 240.

In FIG. 2, an upper $n^{30}$ layer (hereinafter referred to as "a light-receiving surface side n+ layer") 230 forms a pn junction 232 together with the semiconductor substrate 240, thus controlling a moving direction of carries and reducing a recombination loss on an interface having a large number of defects. The light-receiving surface side n+ layer 230 forms a hetero junction together with the wide-gap semiconductor thin film 220 that is located on the upper side. The light-receiving surface side n+ layer 230 further enhances the effect of controlling the moving direction of the carriers by means of an energy band of the hetero junction and has the effect of further reducing a recombination loss on the interface.

The semiconductor substrate 240 is an n-type IV-class substrate. Back surface side p+ layers 250, back surface side n+ layers 252, back surface side insulator films 260, "+" electrodes 270, and "−" electrodes 272 are located on the back surface side of the photoelectric conversion element (in a lower part in FIG. 2), and are substantially the same as the back surface side p+ layers 150, the back surface side n+ layers 152, the back surface side insulator films 160, the "+" electrodes 170, and the "−" electrodes 172 of the photoelectric conversion element shown in FIG. 1 respectively. The semiconductor substrate 240 is substantially the same as the semiconductor substrate 140 of the photoelectric conversion element shown in FIG. 1.

Although the construction of the photoelectric conversion element employing the p-type substrate is shown in the second embodiment, a substantially identical construction can be fabricated by replacing p- and n-layers with each other in the case where an n-layer substrate is employed.

Next, the operation of the photoelectric conversion element shown in FIG. 2 will be described.

First of all, the wide-gap semiconductor thin film 220 having the element causing conductivity is formed on the light-receiving surface side of the semiconductor substrate 240, whereby the light-receiving surface side pn junction 232 of the semiconductor substrate 240 is formed at the time of manufacture without being exposed to oxidative atmosphere.

Secondly, the pn junction 232 is provided on the light-receiving surface side of the semiconductor substrate 240, whereby carriers produced by light are prevented from moving toward the interface having a large number of defects.

Thirdly, the hetero junction formed by the wide-gap semiconductor thin film 220 and the diffusion layer 230 of the semiconductor substrate 240 enhances the effect of preventing carriers produced by light from moving toward the interface having a large number of defects.

Thus, the photoelectric conversion element shown in FIG. 2 also achieves the same effect as the photoelectric conversion element shown in FIG. 1.

The concrete structure (design values) of the photoelectric conversion element shown in FIG. 2 will now be described. The reflection-preventing film 210 is substantially the same as the reflection-preventing film 110 of the photoelectric conversion element shown in FIG. 1. The wide-gap semiconductor thin film 220 is a GaAs film and contains As, which is an element causing conductivity. The element As is quite close in grating constant to Ge, which is a main component of the semiconductor substrate 240. Thus, the element As makes it possible to form a high-quality crystalline thin film. It is to be noted herein that the wide-gap semiconductor thin film 220 has a thickness of 300 nm.

The semiconductor substrate 240 will now be described. The semiconductor substrate 240 has a substrate made of crystalline Ge. The light-receiving surface side n+ layer 230 has a surface carrier concentration of $1\times10^{18}$ cm$^{-3}$ and a diffusion depth of 0.5 μm. The semiconductor substrate 240 is a p-type substrate having a thickness of 150 μm and a carrier concentration of $1\times10^{15}$ cm$^{-3}$. The back surface side p+ layers 250 have a surface carrier concentration of $1\times10^{19}$ cm$^{-3}$ and a diffusion depth of 1.5 μm. The back surface side n+ layers 252 have a surface carrier concentration of $1\times10^{19}$ cm$^{-3}$ and a diffusion depth of 1.5 μm. It is to be noted herein that the light-receiving surface side n+ layer 230 is formed by the diffusion of As constituting the GaAs thin film during formation thereof.

The back surface side insulator films 260, the "+" electrodes 270, the "−" electrodes 272 are substantially the same as the back surface side insulator films 160, the "+" electrodes 170, and the "−" electrodes 172 of the photoelectric conversion element shown in FIG. 1, respectively.

The combination of the p- and n-layers in the concrete example is not limited to the aforementioned one. As another construction, it is also possible to adopt a reversed combination. Although phosphorus (P) is used as an element for causing conductivity in the second embodiment, boron (B), aluminum (Al), gallium (Ga), indium (In), or the like may be used as an element for forming the p-layer. Further, nitrogen (N), arsenic (As), antimony (Sb), or the like may be used as an element for forming the n-layer.

According to the concrete structure as described above with reference to FIG. 2, the following features are obtained in addition to the effect achieved by the photoelectric conversion element shown in FIG. 1.

First of all, since As is quite close in grating constant to Ge and makes it possible to form a high-quality crystalline thin film, a GaAs/Ge interface with a small amount of defects can be formed. Thus, it is possible to reduce a recombination loss on the interface.

Secondly, since the number of defects in the thin film and on the interface is small (i.e., the quality is high), the effect of controlling the moving direction of the carriers by means of the hetero junction is enhanced.

Third Embodiment

Figure 3:
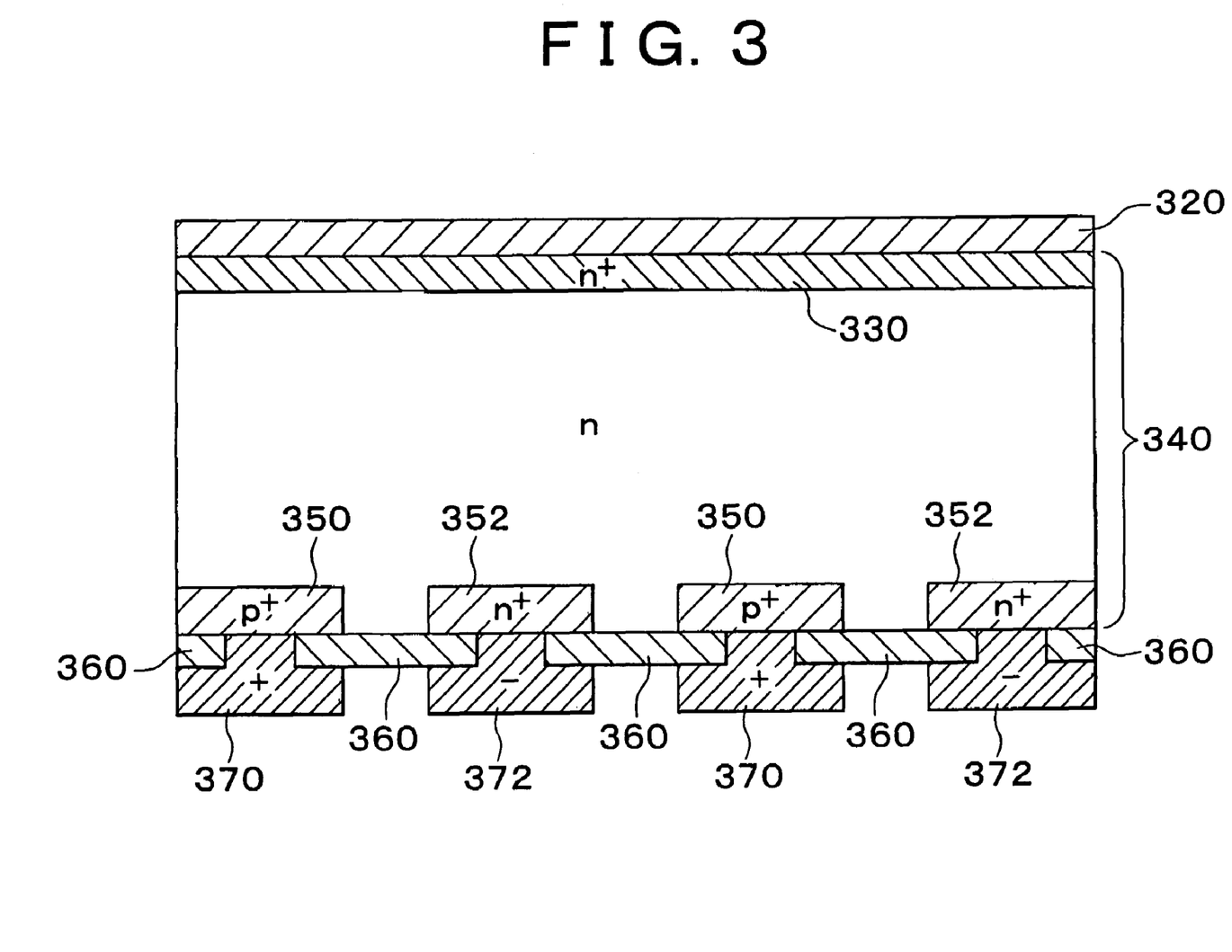
FIG. 3 is a cross-sectional view of a photoelectric conversion element in accordance with a third embodiment of the invention.

FIG. 3 is a cross-sectional view of a photoelectric conversion element in accordance with a third embodiment of the invention. First of all, a light-receiving surface side of the basic construction of the photoelectric conversion element shown in FIG. 3 will be described. An insulative thin film 320 is a thin film that allows penetration of 95% or more of light beams having a wavelength of 800 to 2000 nm and that contains an element causing a conductivity identical to a conductivity of a semiconductor substrate 340. The insulative thin film 320 also functions as a reflection-preventing film.

In FIG. 3, an upper n+ layer (hereinafter referred to as "a light-receiving surface side n+ layer") 330 controls a moving direction of carriers and reduces a recombination loss on an interface having a large number of defects. The light-receiving surface side n+ layer 330 is formed by the diffusion of an element that is contained in the insulative thin film 320 so as to cause conductivity.

The semiconductor substrate 340 is an n-type IV-class substrate. Back surface side p+ layers 350, back surface side n+ layers 352, back surface side insulative films 360, "+" electrodes 370, and "−" electrodes 372, which are located on the back surface side of the photoelectric conversion element (in a lower part in FIG. 3), are substantially the same as the back surface side p+ layers 150, the back surface side n− layers 152, the back surface side insulative films 160, the "+" electrodes 170, and the "−" electrodes 172 of the photoelectric conversion element shown in FIG. 1, respectively. The semiconductor substrate 340 is substantially the same as the semiconductor substrate 140 of the photoelectric conversion element shown in FIG. 1.

Although the construction of the photoelectric conversion element employing the n-type substrate is shown in the third embodiment, a substantially identical construction can be fabricated by replacing p- and n-layers with each other in the case where a p-type substrate is employed.

Next, the operation of the photoelectric conversion element shown in FIG. 3 will be described.

First of all, the insulative thin film 320 having the element causing conductivity is formed on the light-receiving surface side of the semiconductor substrate 340, whereby the light-receiving surface side n+ layer 330 of the semiconductor substrate 340 is formed at the time of manufacture without being exposed to oxidative atmosphere.

Secondly, the diffusion layer 330 whose concentration of the element causing conductivity in the light-receiving surface side of the semiconductor substrate 340 (i.e., carrier concentration) is higher than the concentration of the element contained in the semiconductor substrate 340 is provided, whereby carriers produced by light are prevented from moving toward the interface having a large number of defects.

Thus, the same effect as in the photoelectric conversion element shown in FIG. 1 can be substantially achieved in the photoelectric conversion element shown in FIG. 3 as well. That is, since the carrier recombination loss on the light-receiving surface side is reduced, the conversion efficiency of the photoelectric conversion element is increased. As a result, the power generation amount is increased in the case where the photoelectric conversion element is employed in a TPV system.

The concrete structure (designed values) of the photoelectric conversion element shown in FIG. 3 will now be described. The insulative thin film 320 is an SiNx film, which is a thin film obtained by crystallizing an amorphous SiNx:H film through thermal treatment. The amorphous SiNx:H film contains hydrogen and phosphorus (P) as an element for causing conductivity. The insulative thin film 320 has a thickness of 100 to 200 nm, a phosphorus (P) element concentration of 0.1 to 5% (atomic %), and a hydrogen concentration of 0.01 to 10% (atomic %). The insulative thin film 320 allows penetration of those light beams which are emitted from a light-emitting body (emitter) of the TPV and which are in such a wavelength range that conversion into electric current by means of the photoelectric conversion element is possible, and causes the semiconductor layers to absorb them. The insulative thin film 320 reflects unnecessary light beams and thus prevents a rise in the temperature of the photoelectric conversion element.

The semiconductor substrate 340 will now be described. The semiconductor substrate 340 has a substrate made of crystalline Ge. The light-receiving surface side n+ layer 330 has a surface carrier concentration of $1 \times 10^{18}$ cm$^{-3}$ and a diffusion depth of 0.5 µm. The semiconductor substrate 340 is an n-type substrate having a thickness of 150 µm and a carrier concentration of $1 \times 10^{15}$ cm$^{-3}$ The back surface side p layers 350 have a surface carrier concentration of $1 \times 10^{19}$ cm$^{-3}$ and a diffusion depth of 1.5 µm. The back surface side n+ layers 352 have a surface carrier concentration of $1 \times 10^{19}$ cm$^{3}$ and a diffusion depth of 1.5 µm. It is to be noted herein that the light-receiving surface side n+ layer 330 is formed by the diffusion of phosphorus (P) contained in the amorphous SiNx:H thin film during thermal treatment.

The back surface side insulative films 360 are SiNx films as is the case with the back surface side insulative films 160 of the photoelectric conversion element shown in FIG. 1. The "+" electrodes 370 and the "−" electrodes 372 are also substantially the same as the "+" electrodes 170 and the "−" electrodes 172 of the photoelectric conversion element shown in FIG. 1, respectively.

The combination of the p- and n-layers in the concrete example is not limited to the aforementioned one. As another construction, it is also possible to adopt a reversed combination. Although phosphorus (P) is used as an element for causing conductivity in the third embodiment, boron (B), aluminum (Al), gallium (Ga), indium (In), or the like may be used as an element for forming the p-layer. Further, nitrogen (N), arsenic (As), antimony (Sb), or the like may be used as an element for forming the n-layer.

According to the concrete structure described above with reference to FIG. 3, an effect that is close to the effect achieved by the photoelectric conversion element shown in FIG. 1 or FIG. 2 can be achieved without providing a wide-gap semiconductor thin film, and the manufacturing cost of the photoelectric conversion element can be reduced. Because there is no wide-gap semiconductor thin film provided, there is no possibility of such a wide-gap semiconductor thin film absorbing visible light. Hence, whether the photoelectric conversion element is designed for TPV or not, the photoelectric conversion efficiency for sunbeam, illumination, or the like is enhanced.

Fourth Embodiment

Figure 4:
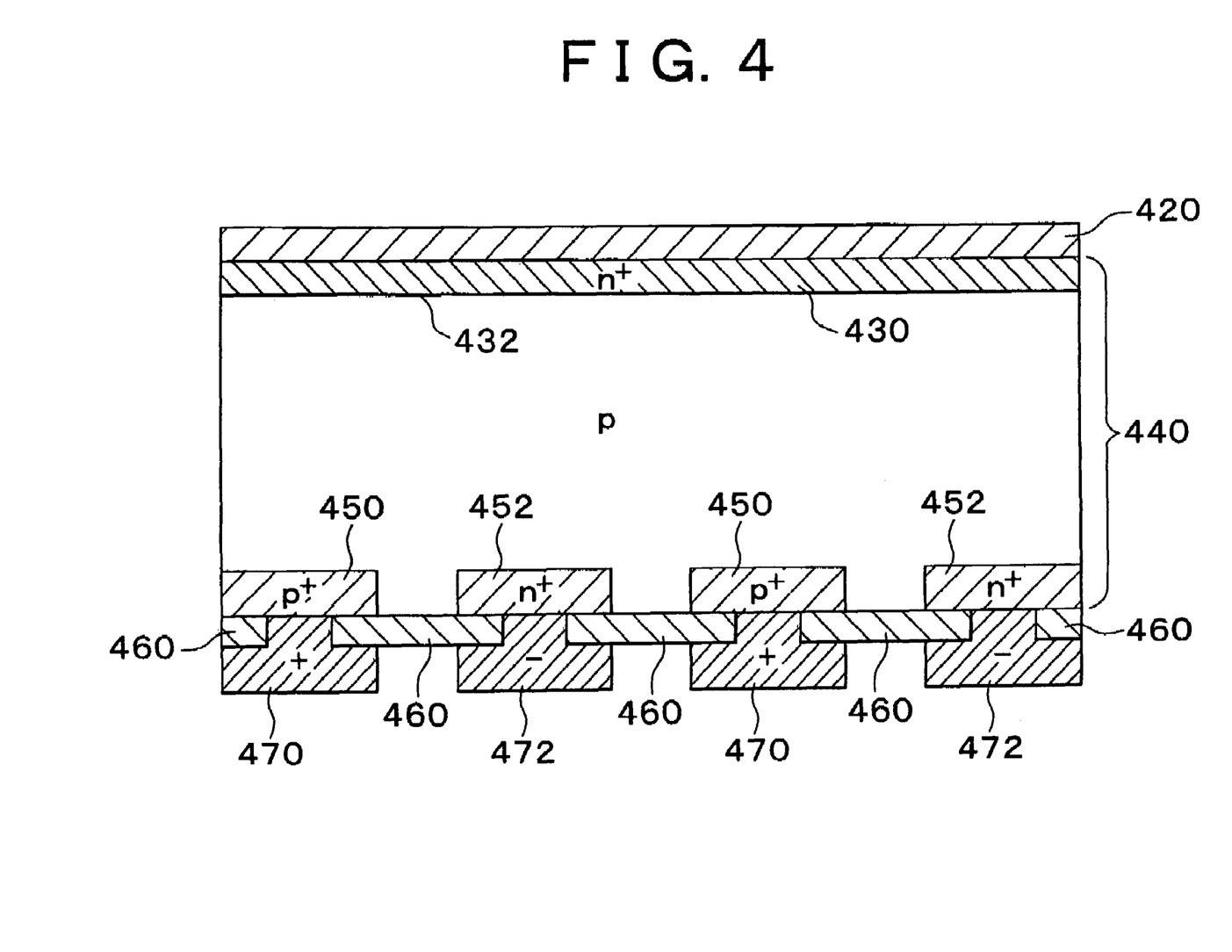
FIG. 4 is a cross-sectional view of a photoelectric conversion element in accordance with a fourth embodiment of the invention.

FIG. 4 is a cross-sectional view of a photoelectric conversion element in accordance with a fourth embodiment of the invention. First of all, a light-receiving surface side of the basic construction of the photoelectric conversion element shown in FIG. 4 will be described. An insulative thin film 420 is a thin film that allows penetration of 95% or more of light beams having a wavelength of 800 to 2000 nm and that contains an element causing a conductivity identical to a conductivity of a semiconductor substrate 440. The insulative thin film 420 also functions as a reflection-preventing film.

In FIG. 4, an upper n+ layer (hereinafter referred to as "a light-receiving surface side n+ layer") 430 forms a pn junction 432 together with the semiconductor substrate 440, thus controlling a moving direction of carriers and reducing a recombination loss on an interface having a large number of defects. The light-receiving surface side n+ layer 430 is formed by the diffusion of an element that is contained in the insulative thin film 420 so as to cause conductivity.

The semiconductor substrate 440 is a p-type IV-class substrate. Back surface side p+ layers 450, back surface side n+ layers 452, back surface side insulative films 460, "+" electrodes 470, and "−" electrodes 472, which are located on the back surface side of the photoelectric conversion element (in a lower part in FIG. 4), are substantially the same as the back surface side p+ layers 150, the back surface side n− layers 152, the back surface side insulative films 160, the "+" electrodes 170, and the "−" electrodes 172 of the photoelectric conversion element shown in FIG. 1, respectively. The semiconductor substrate 440 is substantially the same as the semiconductor substrate 140 of the photoelectric conversion element shown in FIG. 1.

Although the construction of the photoelectric conversion element employing the p-type substrate is shown in the fourth embodiment, a substantially identical construction can be fabricated by replacing p- and n-layers with each other in the case where an n-type substrate is employed.

Next, the operation of the photoelectric conversion element shown in FIG. 4 will be described.

First of all, the insulative thin film 420 having the element causing conductivity is formed on the light-receiving surface side of the semiconductor substrate 440, whereby the light-receiving surface side n+ layer 430 of the semiconductor substrate 440 is formed at the time of manufacture without being exposed to oxidative atmosphere.

Secondly, the pn junction 432 is provided on the light-receiving surface side of the semiconductor substrate 440, whereby carriers produced by light are prevented from moving toward the interface having a large number of defects.

Thus, the same effect as in the photoelectric conversion element shown in FIG. 1 can be substantially achieved in the photoelectric conversion element shown in FIG. 4 as well. That is, since the carrier recombination loss on the light-receiving surface side is reduced, the conversion efficiency of the photoelectric conversion element is increased. As a result, the power generation amount can be increased in the case where the photoelectric conversion element is employed in a TPV system.

The concrete structure (designed values) of the photoelectric conversion element shown in FIG. 4 will now be described. The insulative thin film 420 is an SiNx film, which is a thin film obtained by crystallizing an amorphous SiNx:H film through thermal treatment. The amorphous SiNx:H film contains hydrogen and phosphorus (P) as an element for causing conductivity. The insulative thin film 420 has a thickness of 100 to 200 nm, a phosphorus (P) element concentration of 0.1 to 5% (atomic %), and a hydrogen concentration of 0.01 to 10% (atomic %). The insulative thin film 420 allows penetration of those light beams which are emitted from a light-emitting body (emitter) of the TPV and which are in such a wavelength range that conversion into electric current by means of the photoelectric conversion element is possible, and causes the semiconductor layers to absorb them. The insulative thin film 420 reflects unnecessary light beams and thus prevents a rise in the temperature of the photoelectric conversion element.

The semiconductor substrate 440 will now be described. The semiconductor substrate 440 has a substrate made of crystalline Ge. The light-receiving surface side n$^+$ layer 430 has a surface carrier concentration of $1\times10^{18}$ cm$^{-3}$ and a diffusion depth of 0.5 μm. The semiconductor substrate 440 is a p-type substrate having a thickness of 150 μm and a carrier concentration of $1\times10^{15}$ cm$^{-3}$. The back surface side p layers 450 have a surface carrier concentration of $1\times10^{19}$ cm$^{-3}$ and a diffusion depth of 1.5 μm. The back surface side n$^+$ layers 452 have a surface carrier concentration of $1\times10^{19}$ cm$^{-3}$ and a diffusion depth of 1.5 μm. It is to be noted herein that the pn junction on the light-receiving surface side is formed by the diffusion of phosphorus (P) contained in the amorphous SiNx:H thin film during thermal treatment.

The back surface side insulative films 460 are SiNx films as is the case with the back surface side insulative films 160 of the photoelectric conversion element shown in FIG. 1. The "+" electrodes 470 and the "−" electrodes 472 are also substantially the same as the "+" electrodes 170 and the "−" electrodes 172 of the photoelectric conversion element shown in FIG. 1, respectively.

The combination of the p- and n-layers in the concrete example is not limited to the aforementioned one. As another construction, it is also possible to adopt a reversed combination. Although phosphorus (P) is used as an element for causing conductivity in the fourth embodiment, boron (B), aluminum (Al), gallium (Ga), indium (In), or the like may be used as an element for forming the p-layer. Further, nitrogen (N), arsenic (As), antimony (Sb), or the like may be used as an element for forming the n-layer.

According to the concrete structure described above with reference to FIG. 4, as is the case with the photoelectric conversion element shown in FIG. 3, an effect that is close to the effect achieved by the photoelectric conversion element shown in FIG. 1 or FIG. 2 can be achieved without providing a wide-gap semiconductor thin film, and the manufacturing cost of the photoelectric conversion element can be reduced. Because there is no wide-gap semiconductor thin film provided, there is no possibility of such a wide-gap semiconductor thin film absorbing visible light. Hence, whether the photoelectric conversion element is designed for TPV or not, the photoelectric conversion efficiency for sunbeam, illumination, or the like is enhanced.

The semiconductor substrates 140, 240, 340, and 440 in the photoelectric conversion elements shown in FIGS. 1, 2, 3, and 4 respectively are mainly made of a IV-class component. However, in order to adapt to infrared rays generated by the light-emitting body of the TPV system, it is preferred that Ge be a main component of the semiconductor substrate. In the case where light emitted by the light-emitting body has a short wavelength (i.e., visible light), SiGe, Si, or SiC can be used as a main component of the semiconductor substrate. It is to be noted herein that the composition ratio of SiGe or SiC is arbitrary. In particular, Si and SiC make it possible to form an element having a high photoelectric conversion efficiency for sunbeam.

In the photoelectric conversion element shown in FIG. 1 or 2, the semiconductor thin film 120 or 220 that is larger in band gap than the substrate can be mainly composed of SiGe, Si, SiC, or C. In order to enlarge the band gap and reduce the numbers of defects in an amorphous polycrystal, the semiconductor thin film 120 or 220 has H, F, or Cl. In the case where a Ge substrate is used, amorphous Si is suited for the semiconductor thin film. Further, in the case where an Si substrate is used, SiC or C is suited for the semiconductor thin film.

Alternatively, in the photoelectric conversion element shown in FIG. 1 or 2, the semiconductor thin film 120 or 220 that is larger in band gap than the substrate can be mainly composed of a III-V-class compound. More specifically, GaAs, AlGaAs, GaInAs, GaInP, GaSb, or the like is used for the semiconductor thin film 120 or 220. These compounds contain a IV-class element (Ge, Si, or the like) causing conductivity as a main component. This IV-class element is made into the semiconductor substrate. The compounds are diffused toward the substrate through thermal treatment, thus making it possible to form a high-concentration semiconductor layer or a pn junction.

In the photoelectric conversion element shown in FIG. 3 or 4, SiNx, SiOx, TaOx, TiOx, or the like can be used as a main component of the insulative thin film 320 or 420. The insulative thin film 320 or 420 demonstrates a large light-transmission ratio, high heat resistance, and high chemical resistance. If insulative thin film 320 or 420 further contains H, F, or the like, the number of defects on the interface between the insulative thin film and the semiconductor substrate can be reduced. In this case, the insulative thin film 320 or 420 functions as an excellent protective film. By ensuring that the insulative thin films 320, 420 have a suitable thickness, they can be used as reflection-preventing films as well.

In the photoelectric conversion element shown in FIG. 1 or 2, in the case where SiGe, Si, SiC, C, or the like is used as a main component of the semiconductor film 120 or 220, a plasma CVD (plasma assisted chemical vapor deposition) device can be used as a means for forming the semiconductor thin film or the insulative thin film.

Figure 5:
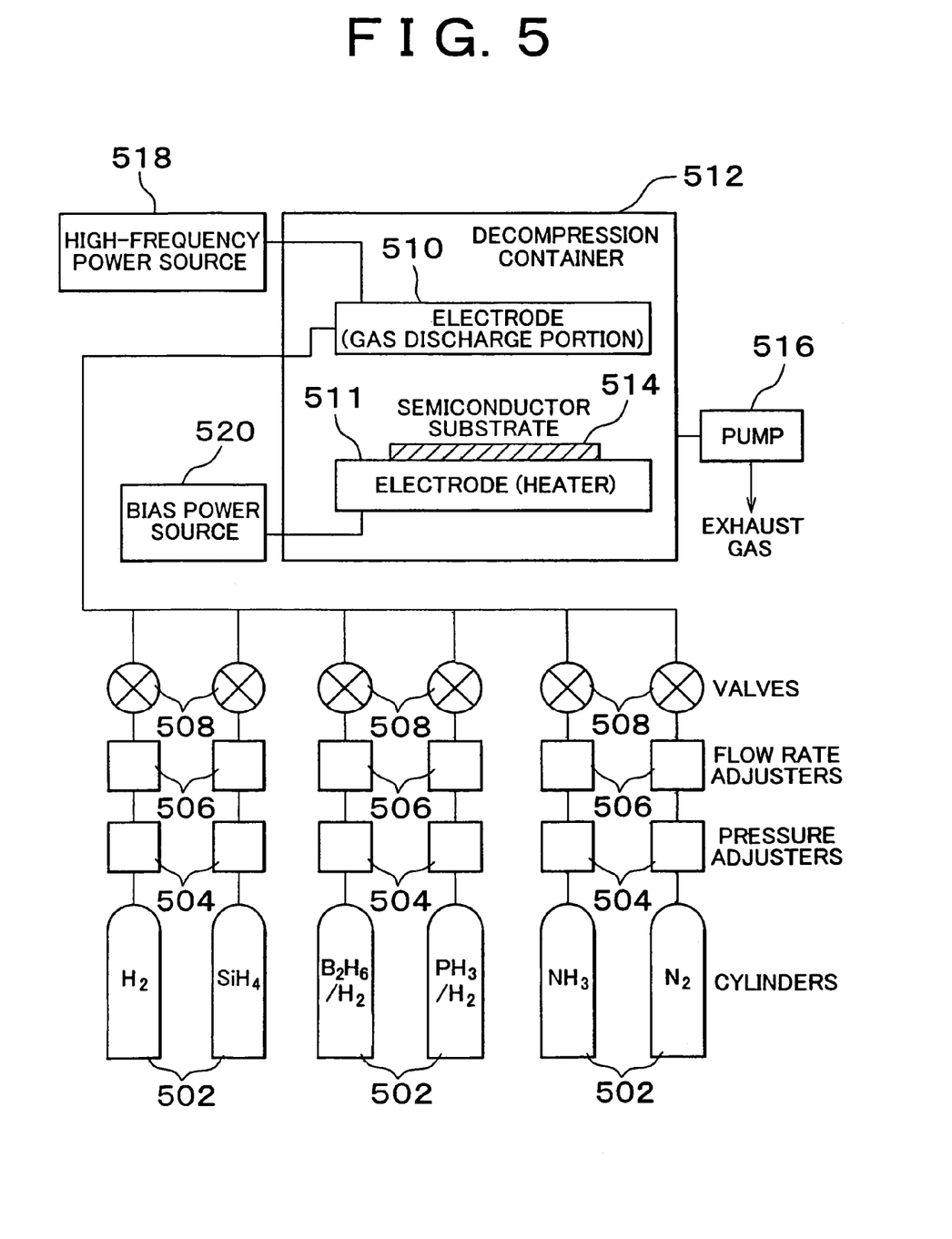
FIG. 5 shows a plasma CVD device.

By the same token, the plasma CVD device shown in FIG. 5 can also be used in the case where SiNx, SiOx, TaOx, TiOx, or the like is used as a main component of the insulative thin film 320 or 420 in the photoelectric conversion element shown in FIG. 3 or 4.

That is, as shown in FIG. 5, the plasma CVD device is provided with a plurality of gas sources (gas cylinders) 502 for supplying a main component (Si, SiC, or the like) constituting the thin film, a component (H, F, Cl, or the like) for reducing the number of defects, and an element (P, B, or the like) causing conductivity in the substrate. The amount of gas in each of the gas sources 502 is adjusted by a corresponding one of pressure adjusters 504, flow rate adjusters 506, and valves 508. The components and the element are supplied to a decompression container 512 from a gas discharge portion provided in an electrode 510.

Furthermore, a pair of electrodes, namely, the electrode 510 and an electrode 511 that are spaced apart from each other and disposed in a space as a gas decomposition portion are provided in the decompression container 512. A semiconductor substrate 514 is installed in one of the electrodes that also functions as a heater, namely, in the electrode 511. It is to be noted herein that a bias power source 520 is connected to the electrode 511. Pressure adjustment is carried out while a pump decompresses the inner space of the container. Electricity is discharged by a high-frequency power source 518, whereby gas is decomposed and activated. Hence, a desired semiconductor thin film or a desired insulative thin film is formed on a surface of the semiconductor substrate 514.

According to such a manufacturing method, the gas component ratio, the pressure, the substrate temperature, the high-frequency power, the time required for formation, and the like are adjusted, whereby a thin film having a desired component ratio and a desired thickness can be formed with high precision. Further, since the thin film can be formed in reducing atmosphere or inactive atmosphere, it is possible to prevent an increase in the number of defects on the surface of the substrate. Thus, the thin film for forming a diffusion layer or a pn junction can be formed on the light-receiving surface side of the semiconductor substrate.

For example, a method of forming an amorphous Si film containing P on the light-receiving surface side of the semiconductor substrate will be described with reference to FIG. 5. Gases used herein have a component ratio of $SiH_4$: 9.8%, $H_2$: 90%, and $PH_3$: 0.2%. The substrate is at a temperature of 250° C. The pressure is 30 Pa. The high-frequency power source has a frequency of 13.56 MHz. The power density (per area of the electrodes) is 0.2 w/cm$^2$. An amorphous Si thin film having a hydrogen concentration of 10% and a phosphorus (P) element concentration of 2% is formed under this condition.

In the case where the semiconductor thin film 120 (FIG. 1) or 220 (FIG. 2) that is mainly composed of SiGe, Si, SiC, C, or the like or the insulative thin film 320 (FIG. 3) or 420 (FIG. 4) that is mainly composed of SiNx, SiOx, TaOx, TiOx, or the like is formed, an ECR (electron cyclotron resonance) plasma CVD device can be used instead of the plasma CVD device shown in FIG. 5.

Figure 6:
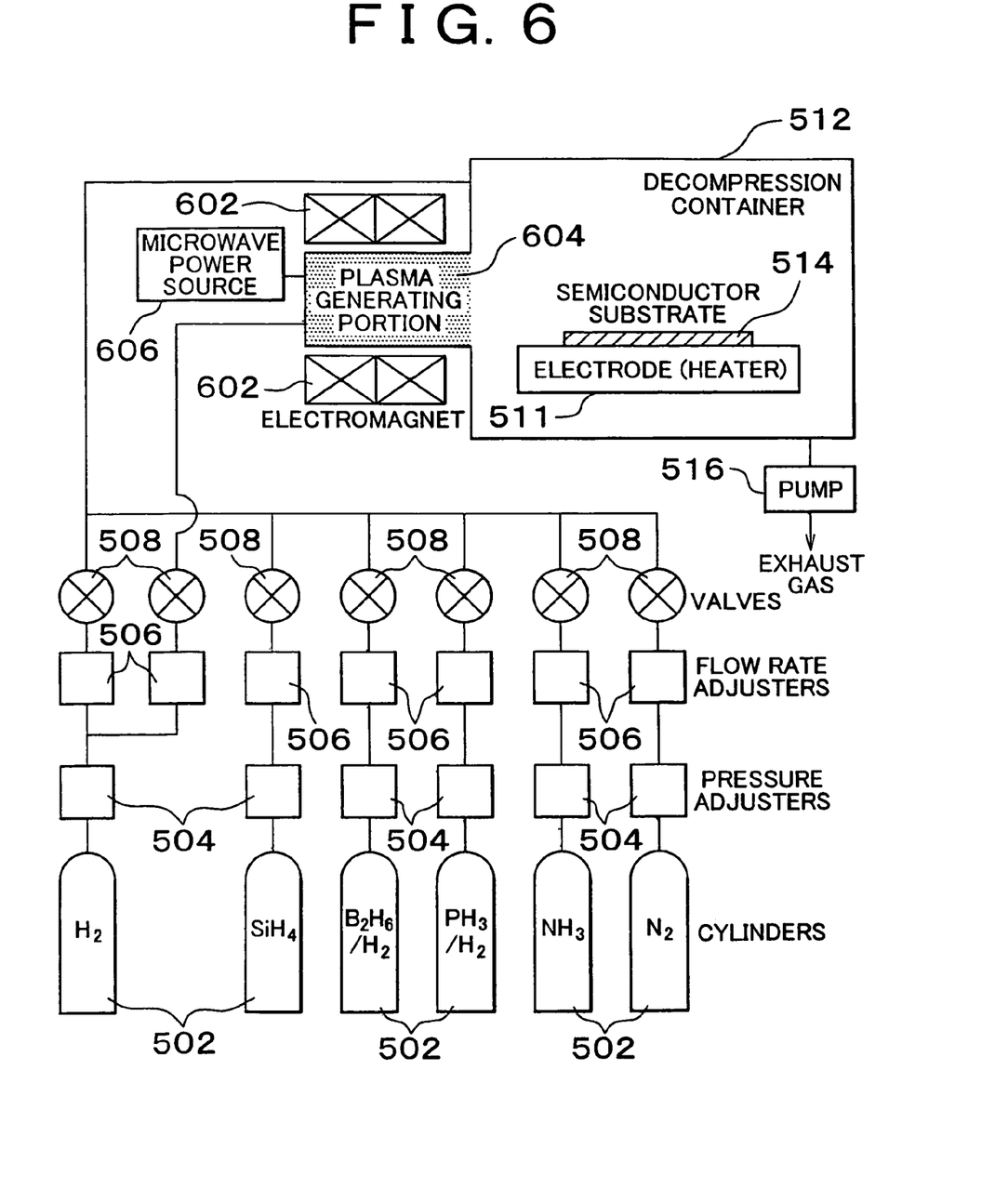
FIG. 6 shows an ECR plasma CVD device.

The case where the ECR plasma CVD device shown in FIG. 6 is used will now be described as to what is different from the case where the plasma CVD shown in FIG. 5 is used. In the ECR plasma CVD device shown in FIG. 6, a plasma generating portion 604 for applying a magnetic field by means of an electromagnet 602 is provided in the decompression container 512. Microwaves are supplied from a microwave power source 606 so as to discharge electricity from the plasma generating portion 604.

Further, the plasma generating portion 604 is provided with one of the gas sources 502 that supplies $H_2$, halogen, or inactive gas. The decompression container 512 is separately provided with the other gas sources 502 for supplying a main component (Si, SiC, or the like) constituting the thin film, a component (H, F, Cl, or the like) for reducing the number of defects, and an element (P, B, or the like) causing conductivity in the substrate.

The $H_2$, halogen, or inactive gas that has been supplied to the plasma generating portion 604 is decomposed or activated. The gas thus decomposed or activated is supplied to the decompression container 512. Then, the gas that has been supplied to the decompression container 512 and that contains the element constituting the thin film is mixed with the gas supplied from the plasma generating portion 604 and is thereby decomposed or activated, whereby the thin film is deposited on the surface of the semiconductor substrate 514.

Thus, unlike the case of the plasma CVD device shown in FIG. 5, the semiconductor substrate 514 is not exposed to the discharge of electricity (the plasma generating portion). Hence, it becomes possible to reduce the number of defects generated on the surface of the semiconductor substrate. Since the number of defects on the surface of the semiconductor substrate is reduced, the recombination loss of carries is reduced and the photoelectric conversion efficiency is increased.

Figure 7:
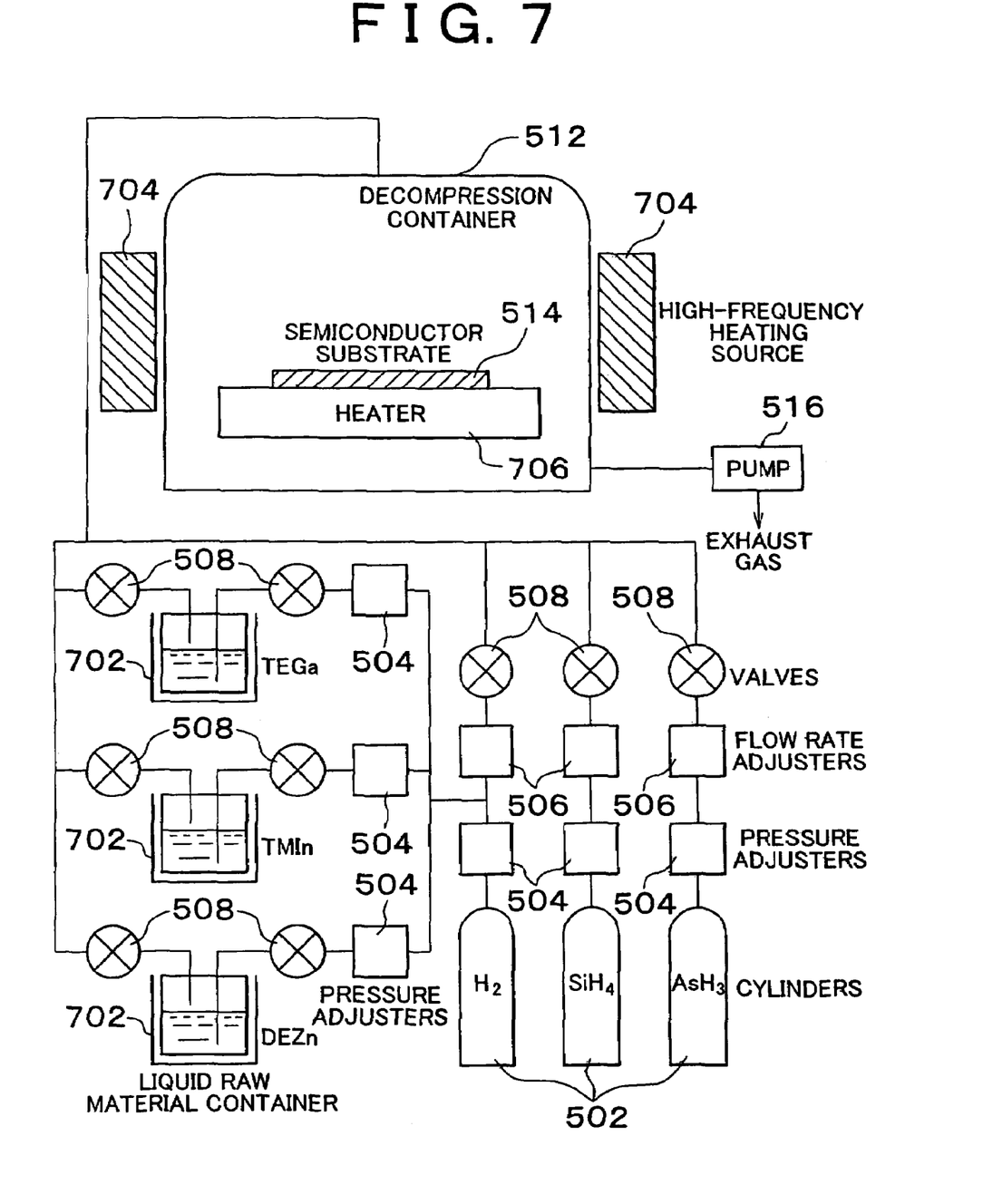
FIG. 7 shows an MOCVD device.

In the case where a III-V-class compound is used as a main component of the semiconductor thin film 120 or 220 in the photoelectric conversion element shown in FIG. 1 or 2, an MO (metal organic) CVD (organometallic vapor-phase deposition) device shown in FIG. 7 can be used as a means for forming the semiconductor thin film.

That is, as shown in FIG. 7, the MOCVD device is provided with a liquid raw material container 702 and the gas sources (gas cylinders) 502 for supplying a main component (Ga, As, In, or the like) as an element for constituting the thin film, an element (Si, Zn, or the like) for causing conductivity in the substrate, and the like. The amount of gas is adjusted by means of the pressure adjuster 504, the flow rate adjuster 506, and the like. Then, the elements and the component are supplied to the decompression chamber 512.

Furthermore, the MOCVD device is provided with a heater 706 and a high-frequency heating source 704 for heating the semiconductor substrate 514. The pressure is adjusted while the pump 516 decompresses the inner space of the container, and gas is decomposed and activated by means of heat. Thus, a desired semiconductor thin film or a desired insulative thin film is formed on the surface of the semiconductor substrate 514.

According to such a manufacturing method, the gas component ratio, the pressure, the substrate temperature, the high-frequency heating source output, the time required for formation, and the like are adjusted, whereby a thin film having a desired component ratio and a desired thickness can be formed with high precision. Further, since the thin film can be formed in reducing atmosphere or inactive atmosphere, it is possible to prevent an increase in the number of defects on the surface of the substrate. As an effect thereof, a III-V-class compound thin film for forming a diffusion layer or a pn junction can be formed on the light-receiving surface side of the semiconductor substrate.

For example, a manufacturing method in which a GaAs film is formed on the light-receiving surface side of the semiconductor substrate will be described with reference to FIG. 7. The gases used herein have a component ratio of TEGa (triethyl gallium): 0.03%, $AsH_3$ (arsine): 1.0%, $SiH_4$: 100 ppm, and $H_2$: approximately 99%. The substrate is at a temperature of 700° C. The pressure is 10000 Pa.

The pn junctions 232, 432 and the light-receiving side $n^+$ layers 130, 230, 330, 430 designed as diffusion layers (semiconductor layers) in the photoelectric conversion elements shown in FIGS. 1 to 4 are formed by fabricating the semiconductor thin film 120 or 220 or the insulative thin film 320 or 420 according to the method described with reference to FIG. 5, 6, or 7 and then performing thermal treatment in inactive atmosphere or reducing atmosphere.

According to such a manufacturing method, thermal treatment is performed in reducing atmosphere or inactive atmosphere, whereby it becomes possible to prevent an increase in the number of defects on the surface of the substrate. As a result, a diffusion layer or a pn junction can be formed on the light-receiving surface side of the semiconductor substrate.

As a concrete example in which a diffusion layer or a pn junction is thus formed, it is acceptable that a quartz furnace whose interior has been maintained clean be adopted as the device, that the gases used herein have a component ratio of $N_2$: 90% and $H_2$: 10%, and that the interior of the furnace be at a temperature of 600° C.

Figure 8:
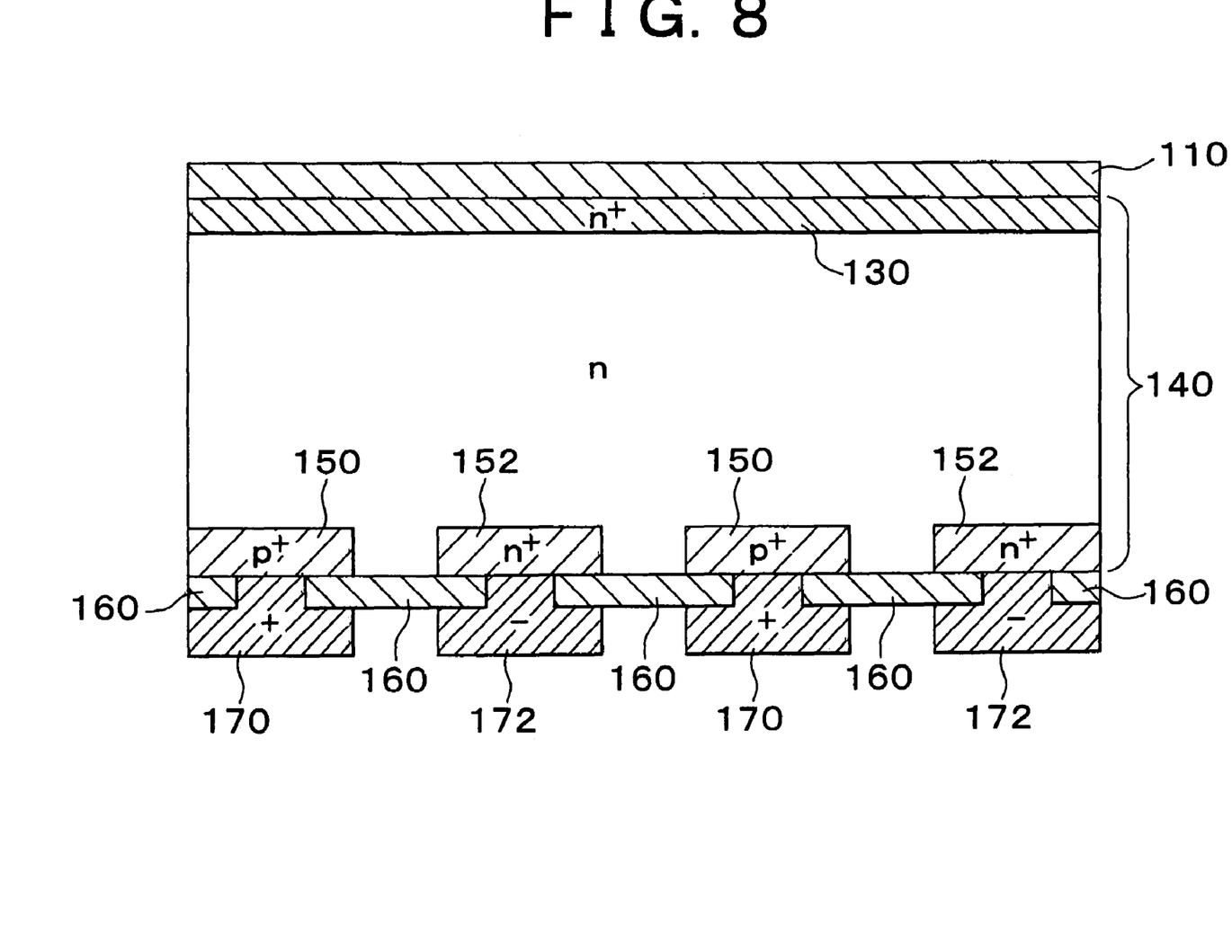
FIG. 8 is a cross-sectional view of a photoelectric conversion element as a referential example.
Figure 9:
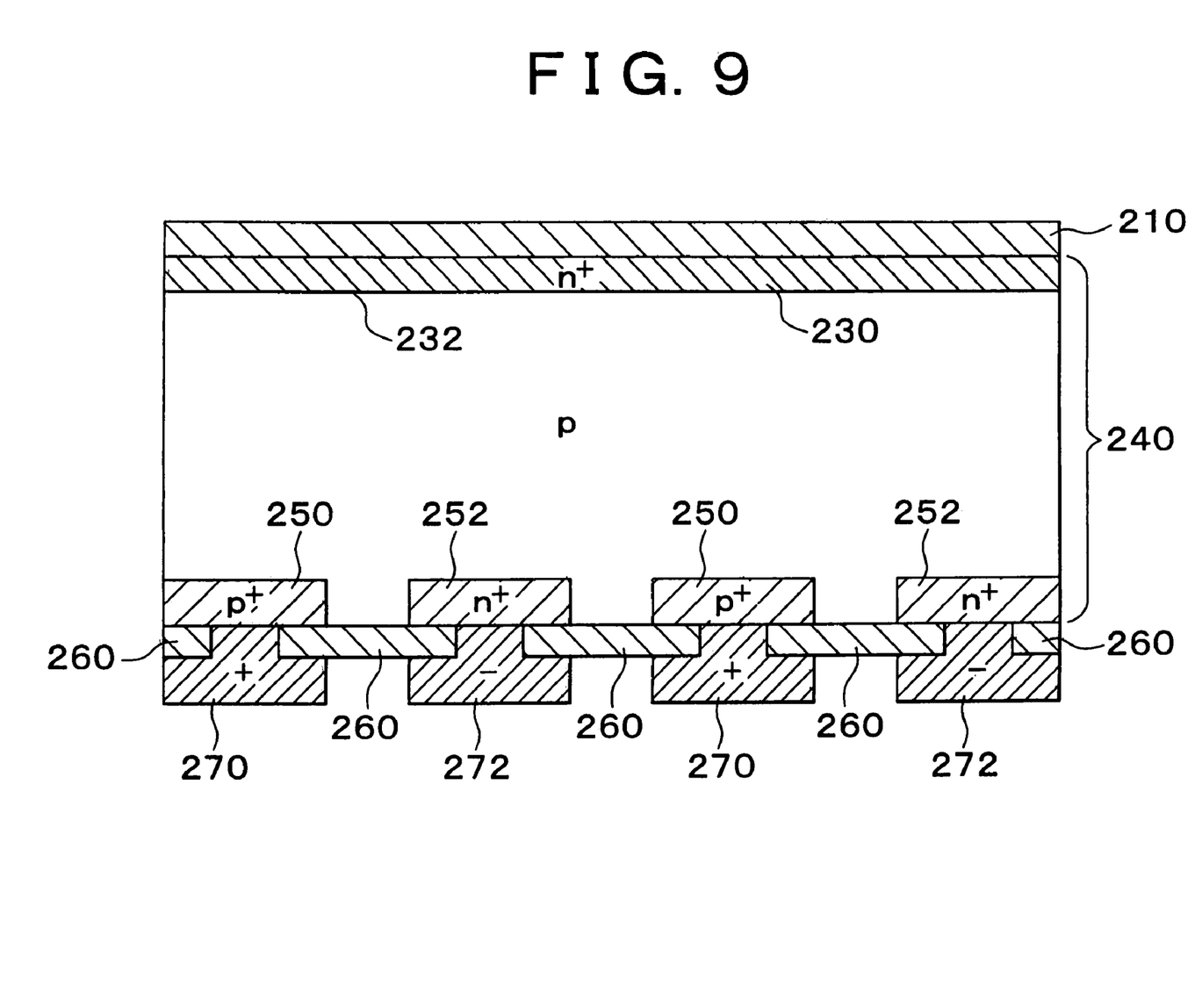
FIG. 9 is a cross-sectional view of a photoelectric conversion element as another referential example.
Figure 10:
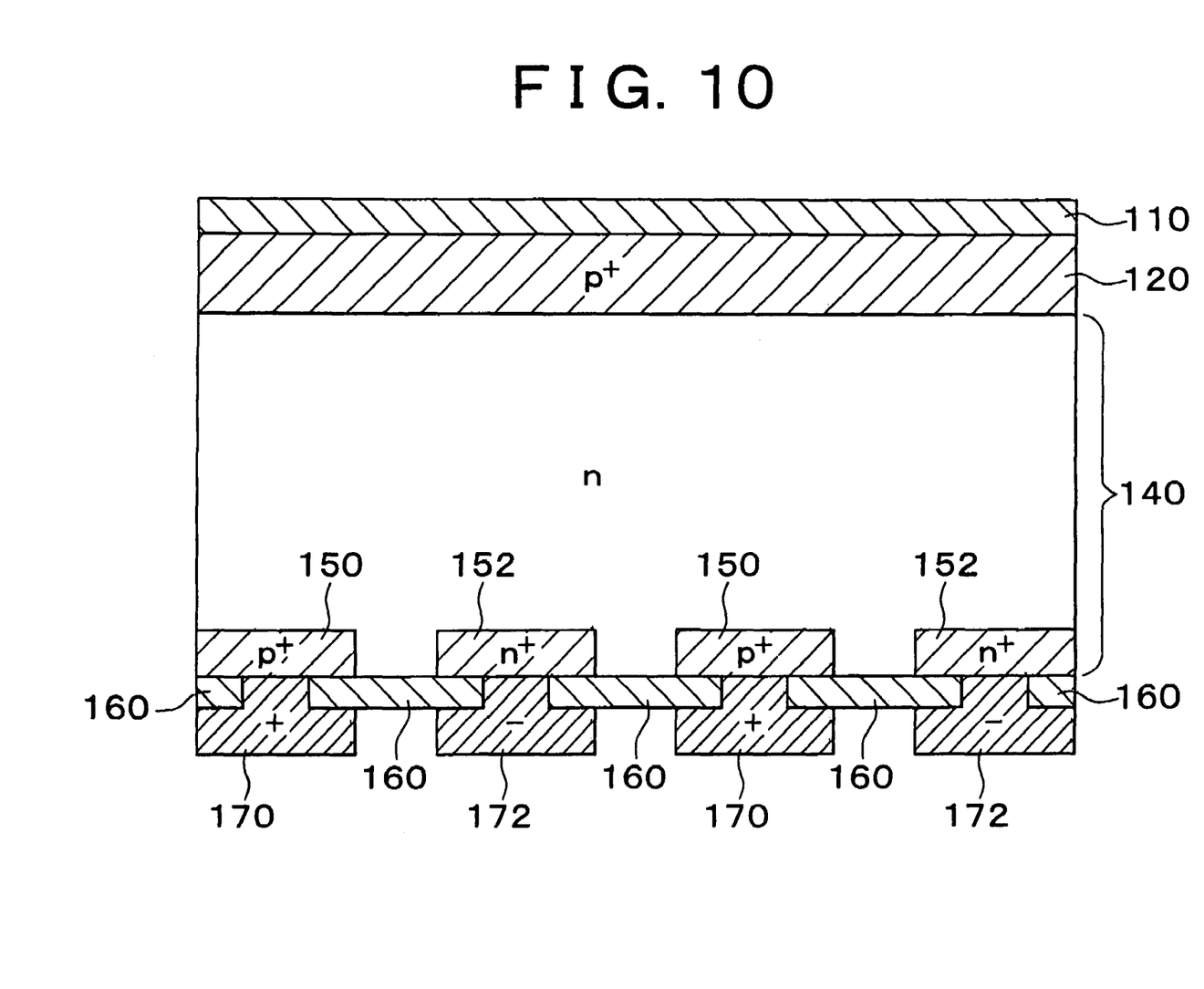
FIG. 10 is a cross-sectional view of a photoelectric conversion element as still another referential example.

For reference, a photoelectric conversion element having a construction shown in FIG. 8 can also be manufactured by thus forming the diffusion layer on the light-receiving surface side of the semiconductor substrate, removing the semiconductor thin film or the insulative thin film, and then providing the reflection-preventing film. A photoelectric conversion element having a construction shown in FIG. 9 can also be manufactured by forming the pn junction on the light-receiving surface side of the semiconductor substrate, removing the semiconductor thin film or the insulative thin film, and then providing the reflection-preventing film. Furthermore, as shown in FIG. 10, a photoelectric conversion element which has no diffusion layer formed and which is provided with a hetero pn junction between a semiconductor thin film and a semiconductor substrate can also be manufactured. The photoelectric conversion elements shown in FIGS. 8, 9, and 10 are suited for standard sunbeam.

As has been described hitherto, according to the invention, a photoelectric conversion element having an element structure capable of forming a light-receiving surface side semiconductor layer (diffusion layer) for controlling the movement of electric charges and reducing a recombination loss in reducing atmosphere and inactive gas atmosphere, and a method of manufacturing the photoelectric conversion element are provided. Hence, the problems caused by the related art including the ion implantation method, the thermal diffusion method, and the like are solved. As a result, by reducing a carrier recombination loss on a light-receiving surface of a photoelectric conversion element adopting Ge as a material suited for TPV power generation and adopting a back surface electrode type as an electrode structure, it becomes possible to enhance the conversion efficiency of the photoelectric conversion element and increase the power generation amount of the TPV system.

What is claimed is:

1. A photoelectric conversion element having electrodes and semiconductor layers that collects carriers disposed only on a back surface of a semiconductor substrate, comprising:
    a semiconductor thin film provided on a light-receiving surface side of the semiconductor substrate, the semiconductor thin film comprising a semiconductor having a larger band gap than a band gap of the semiconductor substrate and containing an element having a conductivity different from a conductivity of the semiconductor substrate; and
    a diffusion layer formed on a surface of the semiconductor substrate via diffusion of the element contained in the semiconductor thin film and forming a pn junction together with the semiconductor substrate.

2. The photoelectric conversion element according to claim 1, wherein
    the semiconductor substrate mainly comprises a material selected from the group consisting of Ge, SiGe, Si, and SiC.

3. The photoelectric conversion element according to claim 1, wherein
    the semiconductor thin film mainly comprises a one of crystalline, polycrystalline and amorphous material selected from the group consisting of SiGe, Si, SiC, and C.

4. The photoelectric conversion element according to claim 1, wherein
    the semiconductor thin film mainly comprises a one of crystalline, polycrystalline and amorphous material of a III-V-class compound.

* * * * *